United States Patent
Kutz et al.

(10) Patent No.: US 7,370,332 B2
(45) Date of Patent: May 6, 2008

(54) ARRANGEMENT AND METHOD FOR ITERATIVE DECODING

(75) Inventors: Gideon Kutz, Ramat Hasharon (IL); Amir Chass, Ramat Hasharon (IL); Akiva Gabor, Ra'Anana (IL)

(73) Assignee: Freescale Semiconductor, Inc., Austin, TX (US)

(*) Notice: Subject to any disclaimer, the term of this patent is extended or adjusted under 35 U.S.C. 154(b) by 650 days.

(21) Appl. No.: 10/872,077

(22) Filed: Jun. 18, 2004

(65) Prior Publication Data
US 2005/0071726 A1    Mar. 31, 2005

(30) Foreign Application Priority Data
Jun. 18, 2003    (GB) ................... 0314203.1

(51) Int. Cl.
*H03M 13/00*    (2006.01)
(52) U.S. Cl. .................. 718/780; 714/755; 714/786
(58) Field of Classification Search ............. 714/780, 714/755, 786
See application file for complete search history.

(56) References Cited

U.S. PATENT DOCUMENTS

| 5,687,184 | A  | * | 11/1997 | Lorenz et al. ............ 714/704 |
| 6,430,722 | B1 | * | 8/2002  | Eroz et al. ................ 714/755 |
| 7,073,116 | B1 | * | 7/2006  | Settle et al. .............. 714/786 |
| 2002/0159429 | A1 | | 10/2002 | Gueguen |

OTHER PUBLICATIONS

GB 0314203.1 Combined Search and Examination Report.

* cited by examiner

*Primary Examiner*—Guy J. Lamarre

(57) ABSTRACT

An arrangement and method for Turbo processing iterative decoding in a radio receiver comprises receiving a block of data for decoding; decoding a whole block of data to produce a respective decoded output; dividing the received decoded whole block of data into a plurality of sub blocks; producing a determination of whether the decoded output of each of the sub blocks has substantially converged; storing said determination for each of the sub blocks; and further decoding over the whole block of data only sub blocks whose determinations do not indicate substantial convergence.

21 Claims, 3 Drawing Sheets

ARRANGEMENT AND METHOD FOR ITERATIVE DECODING

FIELD OF THE INVENTION

This invention relates to iterative decoding, and particularly (though not exclusively) to iterative decoding such as 'Turbo' decoding in a communication receiver.

BACKGROUND OF THE INVENTION

In the field of this invention it is known that in recent years, iterative decoding has emerged as one of the most promising techniques for improving performance of a communication receiver such as a wireless communication receiver. In an iterative decoding scheme for decoding received transmitted symbols, two receiver modules (e.g., two constituent decoders, equalizer and decoder, multi-user detector and decoder, etc.) are running iteratively while exchanging data. Each decoder module receives an a-priori soft input information and generates an a-posteriori soft output, which serves as an a-priori information to the other decoder module. The quality of the a-priori information improves iteratively until some stopping condition is met.

During the data transmission there will be some data blocks that will be correctly decoded after several iterations, while there will be other blocks that will require more iterations to converge to the error-free result. It is desirable to adopt some method of estimating whether the decoding is correct and to stop the iterations after the method indicates the correct decoding. In this way the average number of iterations, and consequently the average power consumption by the decoding device, can be reduced.

The above method is called 'stopping criteria' for turbo decoding. Several different 'stopping criteria' methods are known:

Cyclic Redunancy Check (CRC) Method

If the encoded blocks contains CRC bits, the cyclic redundancy check is performed after each iteration. If CRC passed, the iterations are stopped. This method:
  Provides the best stopping performance—saves up to 70% iterations comparing to 8 iterations decoding for high SNR (signal to noise ratio) without error-correction degradation
  CRC check that has to be done anyway is performed by decoding device
  Not applicable to blocks without CRC bits
  Introduces processing delay (CRC done after each iteration)

Cross-Entropy (CE) Method

The cross-entropy between the soft output of the current and the previous iterations is calculated. If the computed value is less than a threshold value the iterations are stopped. This method:
  Provides good stopping performance—saves 50%-60% iterations comparing to 8 iterations decoding for high SNR without error-correction degradation
  Requires memory to store the previous iteration data (1 word/encoded_bit)
  Introduces processing delay (cross-entropy calculation done after each iteration)

Sign-Change-Ratio (SRC) Method

The number of sign changes between the extrinsic information of the current and the previous block is calculated. If the number of sign changes is less than a threshold value the iterations are stopped. This method:
  Provides good stopping performance—saves 50%-60% iterations for high SNR without error-correction degradation
  Requires memory to store the previous iteration data (1 bit/encoded_bit)
  Introduces processing delay (SRC done after each iteration)

Hard-Decision-Aided (HDA) Method

After each iteration the hard decision on the information bits is done. If the hard decision of the current and the previous block agree, the iterations are stopped. This method:
  Provides good stopping performance—similar to CE and SRC methods
  Requires memory to store the previous iteration data (1 bit/encoded_bit)
  Introduces processing delay (the processing done after each iteration)

The LLR (Log Likelihood Ratio) Amplitude Aided (LAA) Method

The absolute value of the amplitude of each extrinsic data is compared to a threshold value. A counter counts the number of times the amplitude exceeds the threshold. At the end of each iteration, the count is compared to a certain threshold. When the count is higher than the threshold, the iterations are stopped. This method:
  Provides the simplest criteria for hardware implementation—requires only one comparator and one counter.
  Introduces no processing delay.
  Provides performance equivalent to CE, SRC and HDA.

However, all these prior art methods have the disadvantage that they work only on a whole block. Iterations will always be done on the whole block even in cases where most of the bits in the block converged to the right solution and only a small fraction of it needs more iterations to converge. This results in a significant waste of processing resources. A need therefore exists for an iterative decoding scheme wherein the abovementioned disadvantage(s) may be alleviated.

STATEMENT OF INVENTION

It will be understood that the present invention is based on a new stopping criteria scheme for iterative (e.g., Turbo) decoding in, for example, a radio receiver. The stopping criteria scheme is based on dividing a block to be decoded into smaller sub blocks and computing the stopping criteria separately for each sub block. The stopping criteria used in each sub block can be any of the prior art criteria. The invention can therefore have similar properties as the prior art (in terms of performance and complexity) combined with a lower average number of iterations and reduced power consumption.

BRIEF DESCRIPTION OF THE DRAWINGS

One arrangement and method for iterative, turbo based processing, decoding incorporating the present invention will now be described, by way of example only, with reference to the accompanying drawing(s), in which.

DESCRIPTION OF PREFERRED EMBODIMENT

Figure 1:
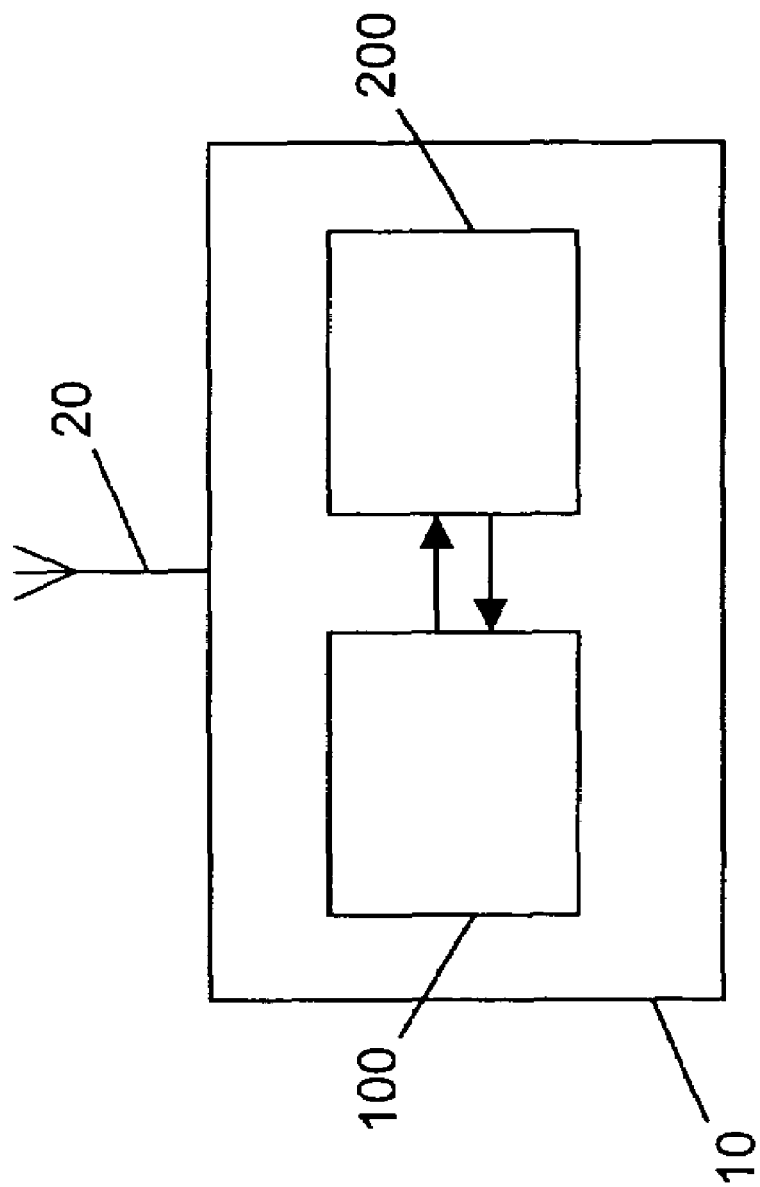
FIG. 1 shows a block schematic diagram illustrating a wireless communication receiver incorporating a, decoding arrangement utilising the invention.

As shown in FIG. 1, a wireless communication receiver, such as a cellular radio, 10 has a transmit/receive antenna 20 and includes a decoding section employing Turbo processing and having first and second decoding arrangements 100 and 200. Turbo processing (well known in the field of the invention, and not requiring further description herein), is an iterative trellis-based decoding scheme in which at each iteration each decoding arrangement receives an a-priori soft input information and generates an a-posteriori soft output, which serves as an a-priori information to the other decoding arrangement. The quality of the a-priori information improves iteratively until some stopping condition is met.

The decoding arrangements 100 and 200 are identical, and so for simplicity only the decoder arrangement 100 will be discussed in further detail. The decoding arrangement 100 (like the decoding arrangement 200) is based on a sub block processing scheme, in which the stopping criteria is computed for each sub block separately and only those sub block which have not converged (stopping criteria is not met), are processed in subsequent iterations. This enables a significant reduction in the average number of sub blocks processed, which is equivalent to a reduction in the average number of iterations. The sub block processing scheme can be combined with CE, SRC, HDA or LAA stopping criteria (and any other criteria except CRC) which operate on each sub block separately. Therefore, the proposed method can have the implementation advantages of the LAA criteria method, combined with lower average number of iterations.

Figure 2:
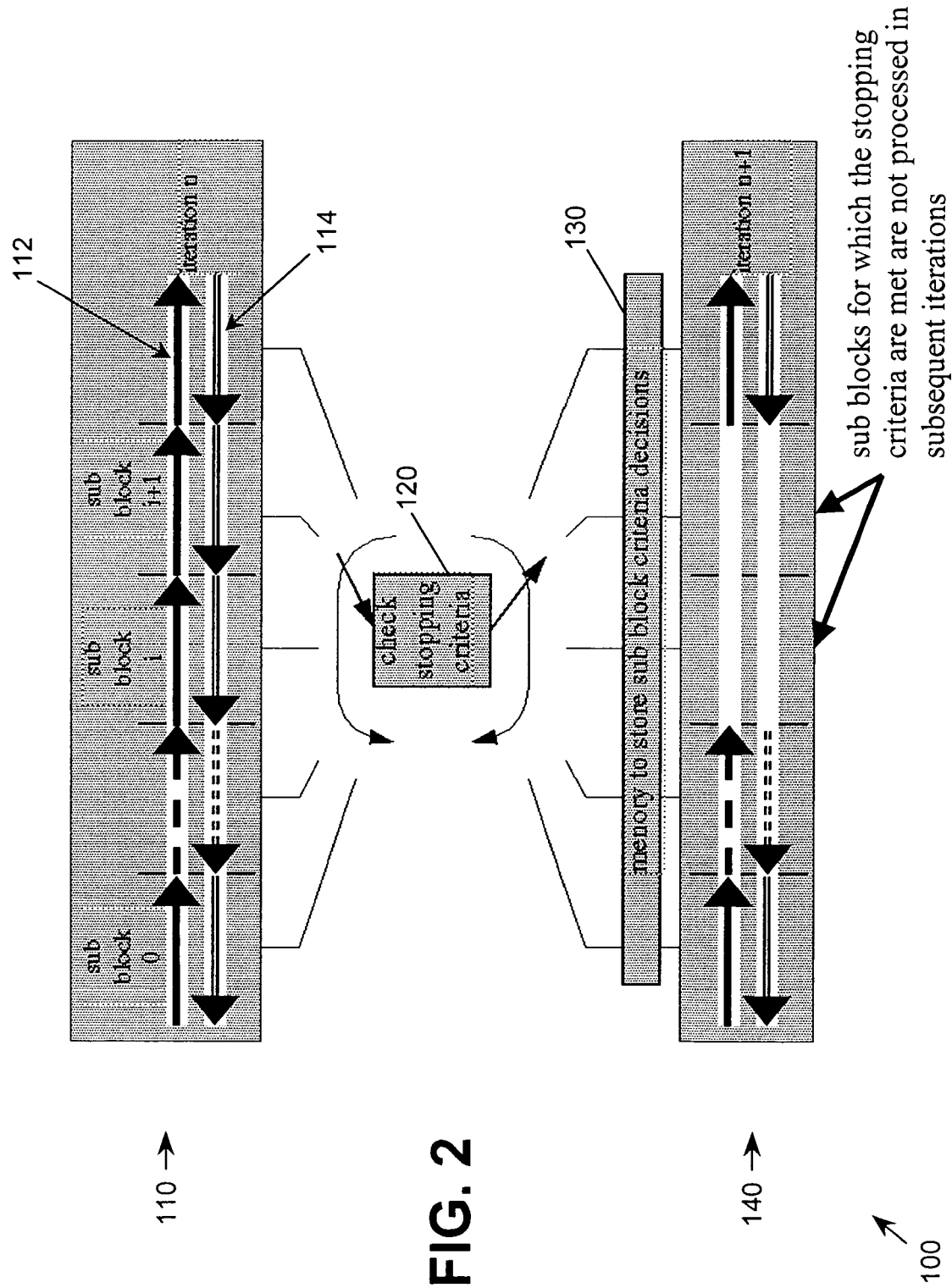
FIG. 2 shows a block schematic diagram illustrating the decoding arrangement.

Referring to FIG. 2, the sub block stopping criteria arrangement 100 will now be considered in more detail. The decoding arrangement 100, receives a block of data (block 110 shown at iteration n, as will be described in greater detail below) to be decoded. The data block contains encoded symbol data which must be decoded to recover the relevant symbols.

In the arrangement 100, each block is divided into smaller sub blocks, and each sub block is processed separately (by forward recursion 112 and backward recursion 114 in known manner). At the end of each iteration, each block is compared (by comparator 120) against stopping criteria, and each output of the comparator 120 forms a stopping criteria decision for the relevant sub block. It will be understood that the CE, SRC, HDA or LAA stopping criteria described and known per se in the prior art can be used as sub block stopping criteria in the comparator 120.

Each stopping criteria decision (which can be simply a single bit, of which for example a '0' value indicates that the stopping criteria have been satisfied and a '1' value indicates that the stopping criteria have not been satisfied) is stored in a memory 130. It will be understood that, in practice, the size required for the additional memory 130 is small: for example, for a block size of 5114 which is the maximum block size for 3GPP ($3^{rd}$ Generation Partnership Project for cellular telephony) Turbo decoding, and for a small sub block size of 128 bit, only 40 bits, or 5 bytes are required to store the decisions for all sub blocks.

At the next iteration n+1 (shown at 140 in FIG. 2), each sub block for which the stopping criteria decision (stored in the memory 130) indicates that the stopping criteria for that sub block have been satisfied are not processed further. In this way, it will be understood that the total number of sub block processing stages may be reduced, since sub blocks in which a-posteriori soft output has already satisfactorily converged are not subjected to unnecessary further processing. As depicted in FIG. 2, after processing iteration n, sub block i and sub block i+1 meet the stopping criteria and so are not processed in iteration n+1.

In practice, to facilitate sub block processing, two problems need to be solved:

initialization of the metrics in the forward recursion when a preceding sub block was not processed (and therefore we don't have its final metrics).

initialization of the metrics in the backward recursion when the subsequent (preceding in the processing order) sub block was not processed (in the backward recursion processing starts from the last stage and proceeds backward to the first—i.e., right to left as shown in FIG. 2—so the sub blocks are also processed in reversed order).

In the preferred embodiment of the present invention, these two problems are solved as follows:

Initialization of the Sub Block Metrics in Backward Recursion

Fortunately, every Turbo processing needs to utilize some kind of sub block processing (only in one direction—usually backward) to keep the required memory size reasonable. If, in the present embodiment, the sub blocks size for stopping criteria purposes is chosen to be identical to the sub block size for memory saving purposes, the same technique can be reused for both purposes. Several sub block methods exist. Next iteration initialization (NII) method which is described next is the most efficient because it requires no additional processing power compared to non sub block processing.

In this method, during the first iteration, a backward recursion metric of each sub block is initialized in a uniform and arbitrary way (e.g., all metrics are initialized to zero).

Figure 3:
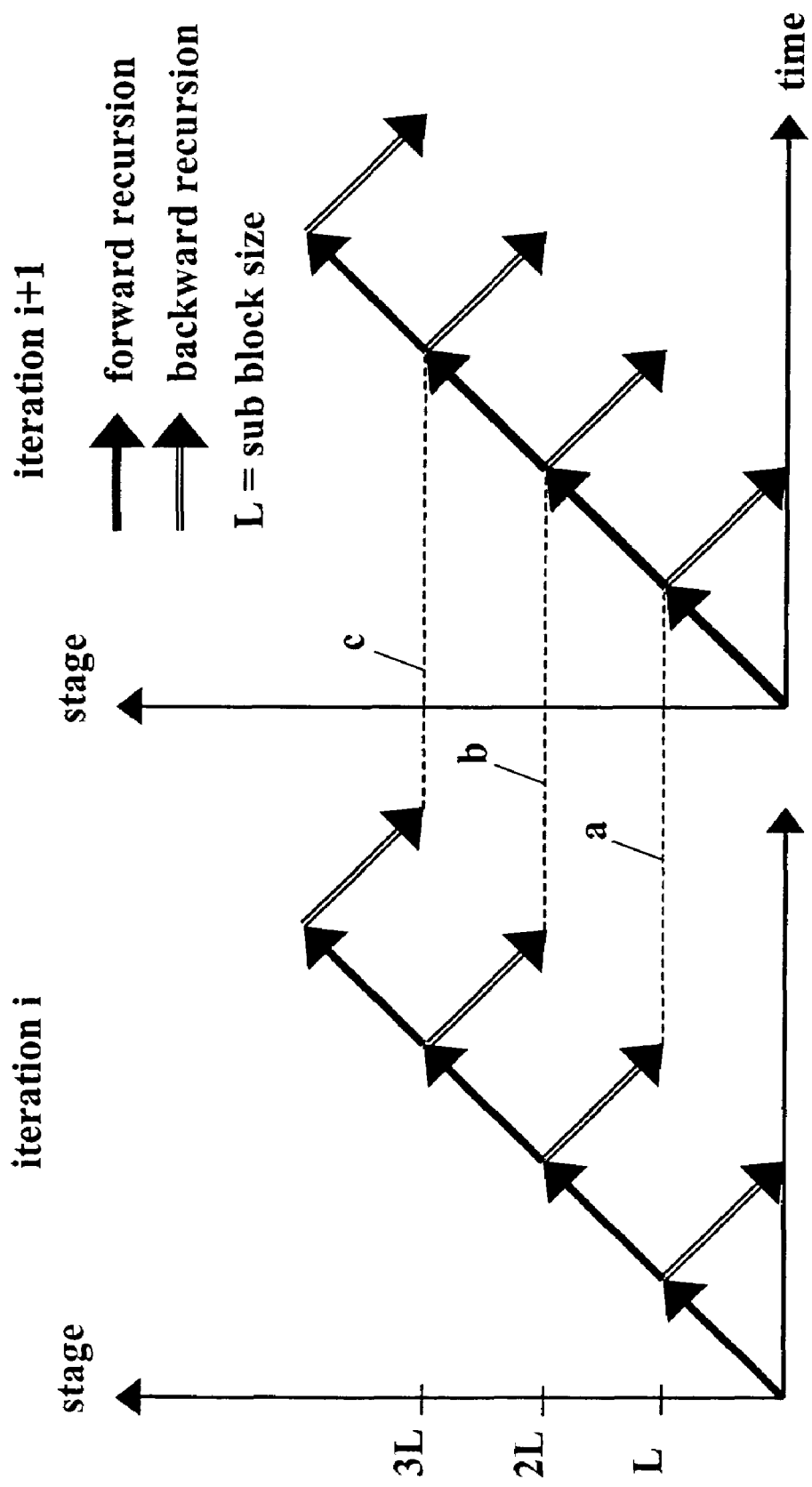
FIG. 3 shows a schematic graphical diagram illustrating different numbers of processing stages used in the decoding arrangement of FIG. 2 to process successive iterations i and i+1 to decode sub blocks.

At the end of each sub block backward processing, the accumulated metrics (beta values) are stored in the NII memory. These metrics serve later as initialization for these processes for the second iteration (metric stored at end of stage i are used for calculation of backward metrics and stage i−1). At each iteration, the backward metrics at the end of each sub block are stored in the NII memory and used for initialization of the next sub block in the subsequent iteration. It should be noted that separate NII memories are required to store metrics for the first decoder (MAP1) and the second decoder (MAP2). The additional memory required for NII implementation for an eight state decoder is thus 2*8*N/L words, where N is the decoding block size and L is the sub block size. The NII method is illustrated in FIG. 3, which shows the maximal number of sub block processing steps for each of two successive iterations i and i+1. It is to be understood that the two successive iterations shown in FIG. 3 do not illustrate the advantageous use of 'sub block stopping criteria' discussed above and shown in FIG. 2, but simply illustrate the NII method (it will therefore be understood that in using the principle of 'sub block stopping criteria', not all of the sub blocks shown in FIG. 3 need actually be processed).

As shown in FIG. 3, each of the iterations i and i+1 have a maximal number of four sub block processing steps, each of which has a forward recursion and a backward recursion. It is to be understood that the NII method as depicted in FIG. 3 is used for the backward recursions only. Considering, for example, the backward recursion between stages 3L and 2L in iteration i, in these stages, the beta values are recursively calculated until stage 2L is reached. At this point, the beta values are stored in the NII memory. In the next iteration i+1, these values are used to initialize the backward recursion from stage 2L to stage L, as depicted by dashed line b). In the same manner, the beta values at other stages in iteration i are stored and used to initialize backward recursions of stages in iteration i+1, as depicted by dashed lines a and c.

Initialization of the Sub Block Metrics in Forward Recursion

As described above, for the backward recursion, the sub block stopping criteria method utilized the fact that all Turbo decoding is done with sub block processing to reduce memory requirements, and the same sub blocks can be used for both purposes. For computing alpha in the forward iteration, however, the Turbo processing is not divided into sub blocks. Usage of NII methods in the forward direction as well may result in a performance degradation. The solution used in this preferred embodiment is to perform the alpha computation not only for blocks which have not yet converged (their stopping criteria have not been met), but also for sub blocks where the subsequent sub block has not yet converged. In these cases, the converged sub block serves as a "learning period" for computing the alphas to be used in the subsequent non-converged sub block. This approach has been simulated and found not to degrade receiver performance. To summarize, three types of processing are done for each sub block:

| sub block status | operation |
| --- | --- |
| Sub block has not converged (stopping criteria has not been met) | Full processing; compute alpha, beta and lambda |
| Sub block has converged but the next sub block has not | Partial processing: only alpha is computed. Beta, lambda are not computed. The extrinsic value is not updated and the NII memory is not updated |
| Otherwise | No processing. Block is skipped. |

Usage of the Sub Block Stopping Criteria as an Abort Criteria

A further advantage of this preferred embodiment is that the sub block based stopping criteria can be easily combined with abort criteria to identify blocks which are undecodable and therefore it is desirable to stop performing iterations on them (to reduce average number of iterations). For example, an abort criterion can be:

If 50% or more of the sub blocks have not converged after N−2 iterations—stop the Turbo decoding (where N is the maximal number of iterations).

This abort criterion has the following advantages:

The same hardware is used both for stopping and abort criteria.

This abort criterion reduces the maximal number of iterations and therefore reduces the worst case data rate requirement. This is because, in the worst case, the decoder will decode only 50% of the sub blocks during iterations N−1 and N. This is equivalent (in complexity) to performing a maximum of N−1 iterations, compared to a maximum of N iterations without the abort criteria.

It will be appreciated that the arrangement for sub block stopping iterative decoding described above will typically be fabricated in an integrated circuit (not shown) for use in the radio receiver 10. It will also be appreciated that the method for sub block stopping iterative decoding described above may alternatively be carried out in software running on a processor (not shown), and that the software may be provided as a computer program element carried on any suitable data carrier (not shown) such as a magnetic or optical computer disc.

It will be understood that the scheme for sub block stopping iterative decoding described above provides the following advantages:

Reduced average number of sub blocks processed, which is equivalent to reducing the average number of iterations.

Reduced power consumption as a result of the reduced number of iterations.

Same scheme serves both for stopping criteria and abort criteria, reducing hardware compared to two separate criteria.

Reduced worst case requirement for decoding rate if sub block based abort criteria is used.

Reduced hardware requirements as a result of reduced worst case decoding rate.

The inventioned claimed is:

1. An arrangement for decoding, the arrangement comprising:

means for receiving a block of data for decoding;

means for decoding a whole block of data to produce a respective decoded output;

means for dividing the received decoded whole block of data into a plurality of sub blocks;

means for producing a determination of whether the decoded output of each of the sub blocks has substantially converged;

means for storing said determination for each of the sub blocks; and means for further decoding over the whole block of data only sub blocks whose determinations do not indicate substantial convergence.

2. The arrangement of claim 1 wherein the means for decoding and the means for further decoding comprise means for performing forward and backward recursion through the sub blocks using next iteration initialization (NII).

3. The arrangement of claim 2 wherein the means for further decoding comprises means for producing alpha values for sub blocks whose determinations indicate substantial convergence and for utilising the produced alpha values in decoding sub blocks whose determinations do not indicate substantial convergence.

4. The arrangement of claim 1 further comprising means for aborting decoding based on the sub block convergence determinations.

5. The arrangement of claim 4 wherein the means for aborting decoding is arranged to abort decoding if fewer than a first predetermined number of sub blocks have substantially converged after a second predetermined number of iterations.

6. The arrangement of claim 5 wherein the second predetermined number is a third predetermined number less than the maximal number of iterations.

7. The arrangement of claim 6 wherein the third predetermined number is 1.

8. The arrangement of claim 1 wherein the means for producing a determination of whether the decoded output of each of the sub blocks has substantially converged comprises means for producing the determination based one of (i)-(iv):
(i) Cross-Entropy (CE) stopping criteria,
(ii) Sign-Change-Ratio (SRC) stopping criteria,
(iii) Hard-Decision-Aided (HDA) stopping criteria, and
(iv) LLR Amplitude Aided (LAA) stopping criteria.

9. The arrangement of claim 1 wherein the iterative decoding is arranged to be performed by Turbo processing.

10. The arrangement of claim 1 fabricated in integrated circuit form.

11. A radio receiver comprising the arrangement of claim 1.

12. A method for iterative decoding, the method comprising:
receiving a block of data for decoding;
decoding the whole block of data to produce a respective decoded output;
dividing the received decoded whole block of data into a plurality of smaller sub blocks;
decoding each of the sub blocks to produce a respective decoded output;
producing a determination of whether the decoded output of each of the sub blocks has substantially converged;
storing said determination for each of the sub blocks; and
further decoding over the whole block of data only sub blocks whose determinations do not indicate substantial convergence.

13. The method of claim 12 wherein the decoding and the means further decoding comprise performing forward and backward recursion through the sub blocks using next iteration initialization (NII).

14. The method of claim 13 wherein the further decoding comprises means producing alpha values for sub blocks whose determinations indicate substantial convergence and utilising the produced alpha values in decoding sub blocks whose determinations do not indicate substantial convergence.

15. The method of claim 12 further comprising aborting decoding based on the sub block convergence determinations.

16. The method of claim 15 wherein the aborting decoding aborts decoding if fewer than a first predetermined number of sub blocks have substantially converged after a second predetermined number of iterations.

17. The method of claim 16 wherein the second predetermined number is a third predetermined number less than the maximal number of iterations.

18. The method of claim 17 wherein the third predetermined number is 1.

19. The method of claim 12 wherein the producing a determination of whether the decoded output of each of the sub blocks has substantially converged produces the determination based one of (i)-(iv):
(v) Cross-Entropy (CE) stopping criteria,
(vi) Sign-Change-Ratio (SRC) stopping criteria,
(vii) Hard-Decision-Aided stopping criteria, and
(viii) LLR Amplitude Aided (LAA) stopping criteria.

20. The method of claim 12 wherein the iterative decoding is performed by Turbo processing.

21. A computer program element stored in a computer readable medium comprising computer program means for performing substantially the method of claim 12.

* * * * *

UNITED STATES PATENT AND TRADEMARK OFFICE
CERTIFICATE OF CORRECTION

| | | |
|---|---|---|
| PATENT NO. | : 7,370,332 B2 | Page 1 of 1 |
| APPLICATION NO. | : 10/872077 | |
| DATED | : May 6, 2008 | |
| INVENTOR(S) | : Gideon Kutz | |

It is certified that error appears in the above-identified patent and that said Letters Patent is hereby corrected as shown below:

In Column 8, Line 9, Claim No. 16:
    Change "Themethod of claim 15" to --The method of claim 15--

Signed and Sealed this

Fourteenth Day of October, 2008

JON W. DUDAS
*Director of the United States Patent and Trademark Office*